United States Patent
Liu et al.

(10) Patent No.: US 10,180,216 B2
(45) Date of Patent: Jan. 15, 2019

(54) LIGHT EMITTING APPARATUS, BACK LIGHT UNIT AND DISPLAY APPARATUS

(71) Applicants: Boe Technology Group Co., Ltd., Beijing (CN); Beijing Boe Display Technology Co., Ltd., Beijing (CN)

(72) Inventors: Jie Liu, Beijing (CN); Xin Gai, Beijing (CN); Dongxi Li, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 331 days.

(21) Appl. No.: 14/555,893

(22) Filed: Nov. 28, 2014

(65) Prior Publication Data
US 2016/0109078 A1 Apr. 21, 2016

(30) Foreign Application Priority Data
Oct. 15, 2014 (CN) .......................... 2014 1 0543742

(51) Int. Cl.
*G02F 1/00* (2006.01)
*F21S 4/00* (2016.01)
(Continued)

(52) U.S. Cl.
CPC ........ *F21S 4/008* (2013.01); *G02F 1/133603* (2013.01); *G02F 1/133608* (2013.01);
(Continued)

(58) Field of Classification Search
CPC ....... F21S 4/008; F21S 4/00; G02F 1/133603; G02F 1/133608; G02F 2201/16; H01L 33/48; H01L 33/62
(Continued)

(56) References Cited

U.S. PATENT DOCUMENTS 8,167,512 B2 * 5/2012 Christensen .......... E01F 13/022
256/13.1
8,388,162 B2 * 3/2013 Park .................. G02F 1/133603
362/249.02
(Continued)

FOREIGN PATENT DOCUMENTS

CN 1261245 7/2000
CN 203325364 12/2013
(Continued)

OTHER PUBLICATIONS

Office action from Chinese Application No. 201410543742.9 dated Jul. 29, 2016.
(Continued)

*Primary Examiner* — Anh Mai
*Assistant Examiner* — Meghan Ulanday
(74) *Attorney, Agent, or Firm* — Calfee, Halter & Griswold LLP

(57) ABSTRACT

This disclosure provides a light emitting apparatus, the apparatus may comprise a middle component, a first end component and a second end component. The middle component may comprise a light emitting device and the middle component has a recess and a protrusion at its two ends respectively. One of the first and second end components has a recess, and the other of the first and second end components has a protrusion. The middle component can be connected with the first and the second end components respectively by corresponding protrusion and recess so that adjacent components can rotate relative to each other in a plane perpendicular to a light exit direction of the light emitting device. The light emitting apparatus can be applied to a back light unit of a display apparatus to realize curved surface display of the display apparatus.

18 Claims, 9 Drawing Sheets

(51) Int. Cl.
*G02F 1/1335* (2006.01)
*H01L 33/48* (2010.01)
*H01L 33/62* (2010.01)

(52) U.S. Cl.
CPC .......... *G02F 2201/16* (2013.01); *H01L 33/48* (2013.01); *H01L 33/62* (2013.01)

(58) Field of Classification Search
USPC ......... 362/97.1, 217.01, 217.14, 217.17, 219
See application file for complete search history.

(56) References Cited

U.S. PATENT DOCUMENTS

| | | |
|---|---|---|
| 2006/0252533 A1 | 11/2006 | Lin et al. |
| 2006/0262533 A1* | 11/2006 | Lin .................... F21S 2/005 362/249.01 |
| 2010/0277665 A1 | 11/2010 | Kuo et al. |
| 2012/0113614 A1 | 5/2012 | Watanabe |
| 2012/0307423 A1 | 12/2012 | Bohn et al. |
| 2013/0272000 A1* | 10/2013 | Pearson ................ F21S 2/005 362/362 |
| 2013/0279179 A1* | 10/2013 | Pearson ................ F21S 2/005 362/364 |

FOREIGN PATENT DOCUMENTS

| | | |
|---|---|---|
| CN | 103544889 | 1/2014 |
| CN | 103869529 | 6/2014 |

OTHER PUBLICATIONS

Office Action from China Application No. 20140543742.9 dated Feb. 15, 2017.

* cited by examiner

LIGHT EMITTING APPARATUS, BACK LIGHT UNIT AND DISPLAY APPARATUS

RELATED APPLICATIONS

The present application claims the benefit of Chinese Patent Application No. 201410543742.9, filed Oct. 15, 2014, the entire disclosure of which is incorporated herein by reference.

FIELD OF THE INVENTION

This disclosure relates to a light emitting apparatus, more specifically, a light emitting apparatus that can be applied to a back light unit of a display apparatus.

BACKGROUND OF THE INVENTION

A display apparatus such as liquid crystal display (LCD), organic light emitting diode (OLED) display is one of the most widely used apparatus currently. In addition to the conventional plane display apparatus, some curved surface display products also appear in the market for meeting requirements of different consumers and different occasions. The existing curved surface display apparatus is mainly achieved by designing the screen of the display apparatus into a curved surface form. Therefore, the design and research on the curved surface display mainly focus on the curved surface design of the screen of the display apparatus. However, due to complexity of technology and relatively low yield, the development cost of the curved surface display screen is relatively high, and thus its application is limited.

The light emitting apparatus applied to a back light unit of a conventional display apparatus is generally in an integrated structure. FIG. 1 shows a light emitting diode (LED) bar in a back light unit of a conventional liquid crystal display. As shown in FIG. 1, the LED bar comprises a plurality of LEDs 101 formed on a common carrier 11. Generally, the carrier of such an LED bar uses a metal material as a base material, an insulating layer and a conductor layer are printed on the base material, i.e., fabricating the carrier into a metal core printed circuit board (MCPCB), then welding the LED on the MCPCB. In an existing curved surface display apparatus e.g. a curved surface liquid crystal display, when such an integrated LED bar is used in the back light unit, the LED bar is generally arranged on a non bending side of the display apparatus in order to reduce thickness of the display apparatus, however, this may result in less homogeneity of image luminance of the curved surface display apparatus. Therefore, when such an integrated LED bar is applied to a back light unit of a curved surface display apparatus, the image quality of the curved surface display apparatus will be limited. In addition, failure of one LED in the integrated LED bar may lead to malfunction of the whole LED bar, which causes an inconvenient maintenance of the back light unit and results in a relatively high cost of use of the display apparatus.

SUMMARY OF THE INVENTION

Therefore, it is desired to provide an improved light emitting apparatus which can mitigate or avoid the above problems.

According to an aspect of the present invention, a light emitting apparatus is provided. The light emitting apparatus may comprise a middle component, a first end component and a second end component. The middle component may comprise a light emitting device and has a recess and a protrusion at its two ends respectively. One of the first and second end components has a recess, and the other of the first and second end components has a protrusion. The middle component can be connected with the first and the second end components respectively by corresponding protrusion and recess so that adjacent components can rotate relative to each other in a plane perpendicular to a light exit direction of the light emitting device.

According to an embodiment of the present invention, for the first end component, the middle component and the second end component in connection, there may be a gap between the recess and the protrusion of the adjacent components. The existence of the gap is favorable for heat dissipation of the light emitting apparatus.

According to another embodiment of the present invention, each of the first end component, the middle component and the second end component may comprise an electrode layer, and for the first end component, the middle component and the second end component in connection, the electrode layers of the adjacent components are in electrical contact with each other. Further, the electrode layer of each of the first end component, the middle component and the second end component may extend to an end face of the recess and the protrusion of the component where it locates. By arranging the electrode layers, the first end component, the middle component and the second end component can be electrically connected with one another.

According to yet another embodiment of the present invention, the number of the middle component comprised by the light emitting apparatus may be more than one, and the middle components can be connected successively by corresponding recesses and protrusions. In this way, light emitting apparatuses of different lengths can be achieved by adjusting the number of the middle components, thereby meeting requirements of different applications.

According to a further embodiment of the present invention, each of the recesses and the protrusions of the first and second end components as well as the recess and the protrusion of the middle component may comprise an arcuate portion, and for the first end component, the middle component and the second end component in connection, the arcuate portion of the recess of one component and the arcuate portion of the protrusion of the other component in the adjacent components are in contact with each other.

Further, the arcuate portion of each of the recess of the first or the second end components and the recess of the middle component may be a major arc. The arcuate portion of each of the protrusion of the first or the second end components and the protrusion of the middle component may also be a major arc. Optionally, the arcuate portion of the recess of one component and the arcuate portion of the protrusion of the other component in the adjacent components have the same radius of curvature. By designing shapes of the recess and the protrusion to make them comprise an arcuate portion, a better rotation effect of the adjacent components relative to each other can be achieved. Moreover, the arcuate portion of the major arc enables connection between the adjacent components to be more stable and reliable.

According to a further embodiment of the present invention, at least one of the first end component and the second end component may comprise a connector, and the light emitting device can be powered by an external power supply system via the connector.

According to a further embodiment of the present invention, at least one of the first end component and the second end component may comprise a light emitting device. Thus the luminance at two ends of the light emitting apparatus can be enhanced.

According to a further embodiment of the present invention, the rotation of the adjacent components relative to each other in the plane perpendicular to the light exit direction of the light emitting device enables the light emitting apparatus to bend in the plane, the radius of curvature R of bending is:

$$R = \frac{L}{2} \cdot \frac{1}{\sin\frac{\alpha}{4}}$$

wherein L is a length of the middle component, $\alpha$ is a rotation angle of the rotation of the adjacent components relative to each other.

According to another aspect of the present invention, a back light unit is provided, which may comprise a light emitting apparatus according to embodiments of the present invention. When the light emitting apparatus according to embodiments of the present invention is used in the back light unit, the curved surface display can be achieved with a relatively low cost and a relatively high yield.

According to a further aspect of the present invention, a display apparatus is provided, the display apparatus may comprise a back light unit mentioned above.

BRIEF DESCRIPTION OF DRAWINGS

Next, the concept and additional advantages of the present invention will be described with reference to the drawings by way of unrestrictive embodiments.

DETAILED DESCRIPTION OF THE INVENTION

In the following, the light emitting apparatus according to embodiments of the present invention will be explained with reference to the drawings by way of examples. The drawings are schematic and are not drawn in scale. The drawings are only used for explaining the embodiments of the present invention rather than limiting the protection scope of the present invention.

Figure 1:
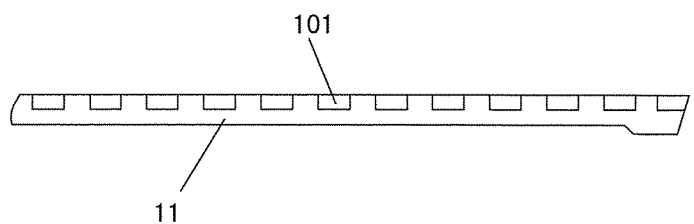
FIG. 1 shows a schematic view of an LED bar in the prior art.

The inventor has recognized that the design and development of the existing curved surface display apparatus mainly focus on design of the screen of the display apparatus into a curved surface form. However, such design and development of a curved surface screen may result in complexity of technology and a relatively low yield, and also results in a relatively high cost of development. On the other hand, when the existing integrated light emitting apparatus e.g. the LED bar (FIG. 1) is applied to a curved surface display apparatus, the image quality of the curved surface display apparatus will be affected. Therefore, the inventor proposes a modularized and bendable light emitting apparatus. The light emitting apparatus for example can be used in a back light unit of a curved surface display apparatus to meet requirement of curved surface display.

Particularly, in the light emitting apparatus according to an aspect of the present invention, since the adjacent components can rotate relative to each other in a plane perpendicular to a light exit direction of the light emitting device, the whole light emitting apparatus can be bended in the plane. Therefore, when such a bendable light emitting apparatus is used in a back light unit of a display apparatus, the curved surface display can be achieved more easily, which improves the yield and will not affect the image quality of the curved surface display apparatus. On the other hand, since the light emitting apparatus adopts a modularized structure, in the case of malfunction of the light emitting apparatus, it only needs to repair or replace the component where the malfunction occurs rather than replacing the whole light emitting apparatus. In this way, the cost of use and maintenance can be reduced.

Figure 2:
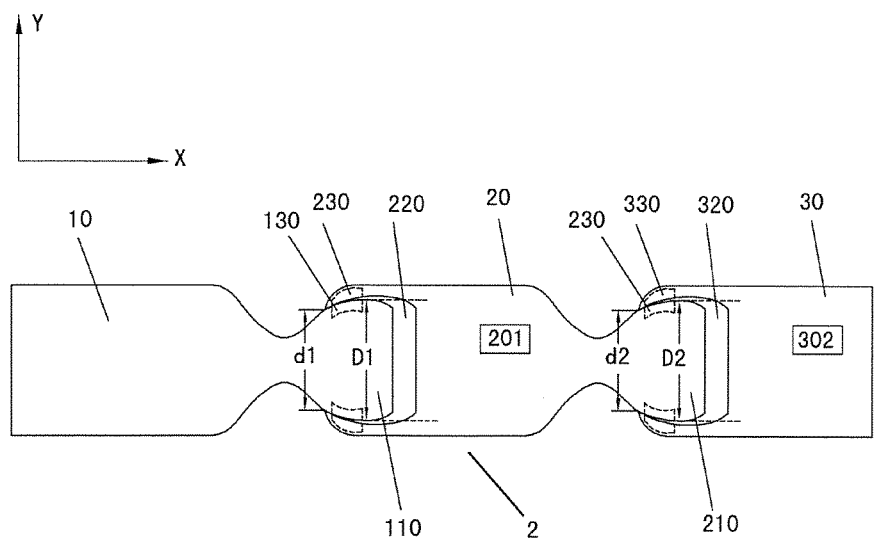
FIG. 2 schematically shows a light emitting apparatus according to an embodiment of the present invention.

FIG. 2 schematically shows a light emitting apparatus 2 according to an embodiment of the present invention. The light emitting apparatus 2 may comprise a first end component 10, a middle component 20 and a second end component 30. FIG. 2 shows a connection state of the three components in the form of a top view.

As shown in FIG. 2, the middle component 20 of the light emitting apparatus 2 may comprise a light emitting device 201. The light emitting device 201 may be any appropriate light emitting device that can serve as a light emitting source, e.g. LED, OLED, bulbs or other point light sources or surface light sources. The middle component 20 has a recess 220 and a protrusion 210 at its two ends respectively. One of the first end component 10 and the second end component 30 has a recess, the other has a protrusion. For example, as shown in FIG. 2, the first end component 10 has a protrusion 110 at its end, and the second end component 30 has a recess 320 at its end. The middle component 20 can be connected with the first end component 10 and the second end component 30 by corresponding protrusions and recesses, so that adjacent components can rotate relative to each other in a plane XY perpendicular to a light exit direction of the light emitting device 201. For Example, the middle component 20 can be connected with the first end component 10 by the protrusion 110 and the recess 220, and the middle component 20 can be connected with the second end component 30 by the protrusion 210 and the recess 320, so that the adjacent components 10, 20 can rotate relative to each other in the plane XY perpendicular to the light exit direction of the light emitting device 201 and the adjacent components 20, 30 can rotate relative to each other in the plane XY perpendicular to the light exit direction of the light emitting device 201.

Optionally, for the first end component 10, the middle component 20 and the second end component 30 in connection, there may be a gap between the recess and the protrusion of the adjacent components. For example, as shown in FIG. 2, there may be a gap between the protrusion 110 of the first end component 10 and the recess 220 of the middle component 20, and there may be a gap between the protrusion 210 of the middle component 20 and the recess 320 of the second end component 30. In this way, it is favorable for heat dissipation of the light emitting apparatus 2 during use.

It should be understood that the gap between the corresponding protrusion and recess of the adjacent components of the light emitting apparatus 2 may be in any shape, rather than being limited to the gap as shown in FIG. 2. For example, the gap formed by non contact portions of the protrusion 110 of the first end component 10 and the recess 220 of the middle component 20 may be in any irregular shape, as long as it does not affect the rotation of the first end component 10 and the middle component 20 relative to each other in the plane perpendicular to the light exit direction of the light emitting device 201.

Further, each of the first end component 10, the middle component 20 and the second end component 30 of the light emitting apparatus 2 may comprise an electrode, and for the first end component 10, the middle component 20 and the second end component 30 in connection, the electrode layers of the adjacent components can be in electrical contact with each other. For example, as shown in FIG. 2, the first end component 10 may comprise an electrode 130, the middle component 20 may comprise an electrode 230, and the second end component 30 may comprise an electrode 330. By arranging electrodes 130, 230, 330, the first end component 10, the middle component 20 and the second end component 30 can be electrically connected with one another.

Optionally, the electrode of each of the first end component 10, the middle component 20 and the second end component 30 may extend to an end face of the protrusion and the recess of the component where it locates. For example, the electrode 130 may extend to the end face of the protrusion 110 of the first end component 10, the electrode 230 may extend to the end faces of the recess 220 and the protrusion 210 of the middle component 20, and the electrode 330 may extend to the end face of the recess 320 of the second end component 30, so that when the first end component 10, the middle component 20 and the second end component 30 are in connection, they can be electrically connected with one another directly.

It should be noted that the electrodes 130, 230, 330 denoted schematically by broken lines in FIG. 2 only illustrate the portion of electrodes 130, 230, 330 that extends to the end faces of the recesses and the protrusions of the first end component 10, the middle component 20 and the second end component 30, respectively. Actually, the electrode layer of each component can be electrically connected with other electrical components included in the first end component 10, the middle component 20 and the second end component 30. For example, the electrode 230 of the middle component 20 can be electrically connected with the light emitting device 201, so that the light emitting device 201 can be powered via the electrode 230 to enable the light emitting device 201 to emit light. In addition, it should be noted that, although the electrodes shown in FIG. 2 are located at two sides of the corresponding recess or protrusion, this is only an example, rather than limitation to the present invention. In fact, the electrodes may also be located at only one side of the corresponding recess or protrusion.

In the light emitting apparatus according to the embodiment of the present invention, the specific shapes of the protrusions and the recesses of the components can be selected based on actual needs, as long as the adjacent components can rotate relative to each other in the plane perpendicular to the light exit direction of the light emitting device after the components are in connection by corresponding protrusions and recesses.

FIG. 2 shows an example of the specific shapes of the protrusions and the recesses. For example, as shown in FIG. 2, each of the protrusion 110 of the first end component 10, the recess 320 of the second end component 30 as well as the recess 220 and the protrusion 210 of the middle component 20 may comprise an arcuate portion, and for the first end component 10, the middle component 20 and the second end component 30 in connection, the arcuate portion of the protrusion 110 of the first end component 10 and the arcuate portion of the recess 220 of the middle component 20 can be in contact with each other, the arcuate portion of the protrusion 210 of the middle component 20 and the arcuate portion of the recess 320 of the second end component 30 can be in contact with each other. In this way, the rotation of the first end component 10 and the middle component 20 relative to each other as well as the rotation of the middle component 20 and the second end component 30 relative to each other in the plane perpendicular to the light exit direction of the light emitting device 201 become easier, thus a better rotation effect of the adjacent components relative to each other can be achieved.

Certainly, what is explained here that the protrusion 110 of the first end component 10 and the recess 320 of the second end component 30 as well as the recess 220 and the protrusion 210 of the middle component 20 may comprise an arch portion is only an example, rather than limitation to the present invention. The corresponding recesses and protrusions of the first and second end components as well as the middle component may also comprise portions in other forms that can be in contact with the protrusions or the recesses of adjacent components. Alternatively, the recesses and protrusions of the corresponding components can also be connected by use of other mechanical connection manners (such as hinge connection) well known by the skilled person in the art, as long as the adjacent components can rotate relative to each other in the plane perpendicular to the light exit direction of the light emitting device.

Further, sizes of the corresponding protrusions and recesses of the components in the light emitting apparatus can be designed so that the connection of the adjacent components is tighter. For example, for the light emitting apparatus 2 as shown in FIG. 2, the sizes of the recess 220 of the middle component 20 and the protrusion 110 of the first end component 10 can be designed such that the distance d1 at the opening of the recess 220 is smaller than the maximum diameter D1 of the protrusion 110. The maximum diameter D1 herein is the maximum distance between outer edges of two sides of the protrusion 110 in Y direction. Similarly, the sizes of the recess 320 of the second end component 30 and the protrusion 210 of the middle component 20 can be designed such that the distance d2 at the opening of the recess 320 is smaller than the maximum diameter D2 of the protrusion 210. The maximum diameter D2 of the protrusion 210 is the maximum distance between outer edges of two sides of the protrusion 210 in Y direction.

Alternatively, the recess or the protrusion of each component in the light emitting apparatus can be arranged in a different way from the above. For example, the light emitting apparatus 2 as shown in FIG. 2 can be modified such that the first end component 10 has a recess, the second end component 30 has a protrusion, and the positions of the recess and the protrusion at two ends of the middle component 20 are exchanged. Such an implementing manner can also achieve connection of the corresponding components.

In addition, at least one of the first end component 10 and the second end component 30 may comprise a connector, and the light emitting device 201 can be powered by an external power supply system via the connector. For example, FIG. 2 shows the situation that the second end component 30 comprises a connector 302. The connector 302 can be electrically connected with the electrode 330 of the second end component 30 and the external power supply system, such that the external power supply system can supply power for the light emitting device 201 via the connector 302 by the electrodes in electrical contact with one another of the components. Or, the first end component 10 may comprise a connector while the second end component 30 does not comprise a connector. Or, the first end component 10 and the second end component 30 may comprise a connector respectively, and the external power supply system can supply power for the light emitting device 201 of the light emitting apparatus 2 via the connectors of the first end component 10 and the second end component 30.

Optionally, at least one of the first end component 10 and the second end component 30 may comprise a light emitting device. Similar to the light emitting device comprised by the middle component, the light emitting device may be any appropriate light emitting device that can serve as a light emitting source, e.g. a LED, an OLED, bulbs or other point light sources or surface light sources. By arranging a light emitting device in the first end component 10 and/or the second end component 30, the luminance at the end of the light emitting apparatus can be enhanced.

Next, each component in the light emitting apparatus 2 according to an embodiment of the present invention will be explained in more detail.

Figure 3A:
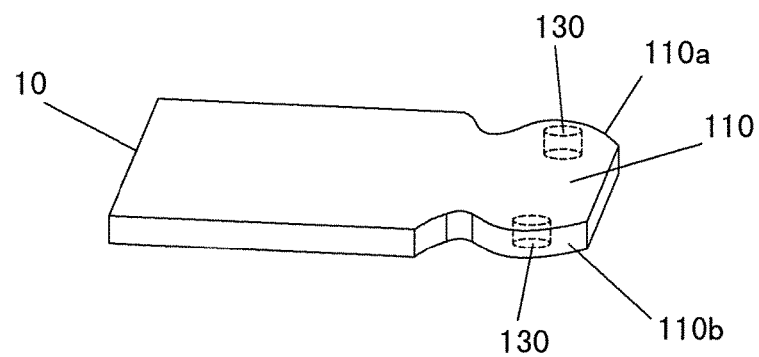
FIGS. 3A and 3B schematically show a perspective view and a top view of a first end component of the light emitting apparatus as shown in FIG. 2 respectively.
Figure 3B:
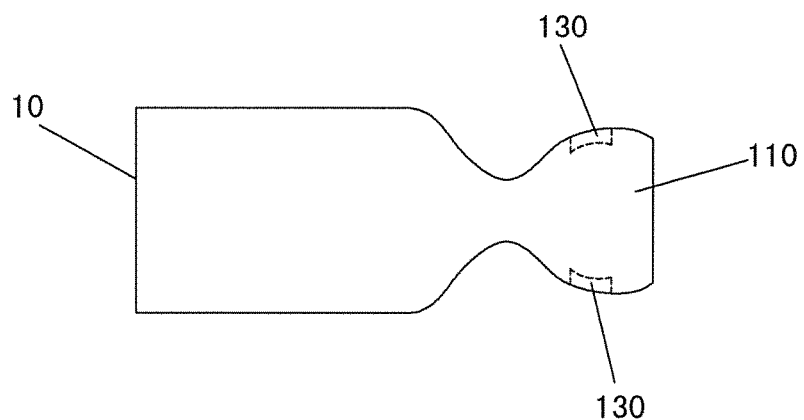

More specifically, FIGS. 3A and 3B schematically show a perspective view and a top view of the first end component 10, respectively. As shown in FIGS. 3A and 3B, one end of the first end component 10 has a protrusion 110. The protrusion 110 can be connected with the recess 220 of the middle component 20, thereby enabling the first end component 10 and the middle component 20 to rotate relative to each other in a plane perpendicular to a light exit direction of the light emitting device 201. The first end component 10 may comprise an electrode 130, and the electrode 130 may extend to the end face of the protrusion 110. When the first end component 10 and the middle component 20 are in connection, the electrode 130 can be in electrical contact with the electrode 230 of the middle component 20, thereby electric connection between the first end component 10 and the middle component 20 can be achieved.

As an example, the protrusion 110 of the first end component 10 may comprise arcuate portions 110a, 110b, and for the first end component 10 and the middle component 20 in connection, the arcuate portions 110a, 110b of the protrusion 110 of the first end component 10 may contact with the corresponding arcuate portions of the recess 220 of the middle component, such that the rotation of the first end component 10 and the middle component 20 relative to each other become easy, so as to achieve a better rotation effect.

Optionally, the electrode layer 130 may extend to the end face of at least one arcuate portion of the arcuate portions 110a, 110b of the protrusion 110. Of course, the protrusion 110 of the first end component 10 that comprises the arcuate portions 110a, 110b illustrated here is merely an example rather than limitation to the present invention. The protrusion of the first end component may also comprise portions in other forms that can contact with the recess of the middle component or comprise other connection mechanisms, as long as the first end component and the middle component can rotate relative to each other in the plane perpendicular to the light exit direction of the light emitting device 201 after being in connection with each other.

The first end component 10 may comprise a carrier formed by an electrode 130, a metal base material and an insulating layer (not shown in the figure). For example, the carrier of the first end component 10 can be fabricated by arranging the insulating layer on the metal base material and then forming the electrode layer on the insulating layer, and the protrusion 110 is formed by shaping the carrier appropriately. For example, the carrier can adopt the form of a MCPCB that is well known by the skilled person in the art. Of course, the above carrier is merely an example. The first end component according to the embodiment of the present invention is not limited to the form of the carrier. The skilled person in the art can select other types of support structure based on specific applications and actual needs and arrange the electrode layer in the corresponding support structure.

Optionally, the first end component 10 may comprise a light emitting device (not shown in the figure). In the case that the first end component 10 comprises a carrier, the light emitting device for example can be arranged on the carrier. Similar as the light emitting device comprised by the middle component, the light emitting device may be any appropriate light emitting device that can serve as a light emitting source, e.g. a LED, an OLED, bulbs or other point light sources or surface light sources. The light emitting device of the first end component 10 can be electrically connected with the electrode 130, such that electric power can be supplied for the light emitting device via the electrode 130, thereby enabling the light emitting device to emit light. By arranging a light emitting device in the first end component 10, the luminance at the end of the light emitting apparatus 2 can be enhanced.

Figure 4A:
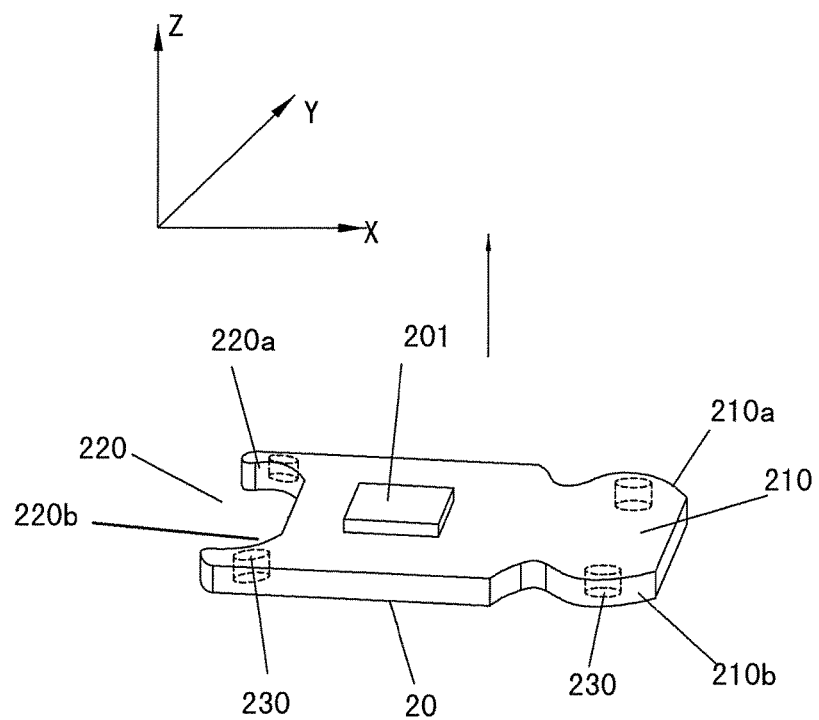
FIGS. 4A and 4B schematically show a perspective view and a top view of a middle component of the light emitting apparatus as shown in FIG. 2 respectively.
Figure 4B:
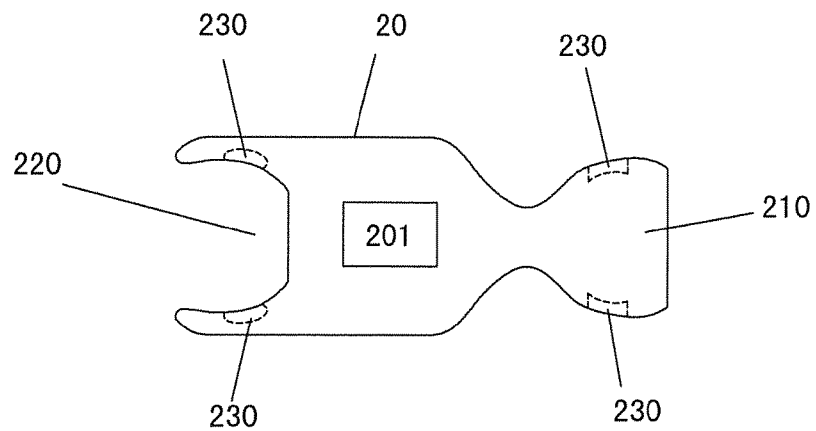

FIGS. 4A and 4B schematically show a perspective view and a top view of the middle component 20, respectively. As shown in FIGS. 4A and 4B, the middle component 20 may comprise a light emitting device 201, and may have a recess 220 and a protrusion 210 at its two ends respectively. The recess 220 and the protrusion 210 of the middle component 20 can be connected with the protrusion 110 of the first end component 10 and the recess 320 of the second end component 30 respectively, thereby enabling the first end component 10 and the middle component 20 to rotate relative to each other in a plane perpendicular to a light exit direction of the light emitting device 201 and enabling the middle component 20 and the second end component 30 to rotate relative to each other in the plane perpendicular to the light exit direction of the light emitting device 201.

For example, as shown in FIG. 4A, the arrow therein represents the light exit direction of the light emitting device 201, i.e. the Z direction. Then the plane perpendicular to the light exit direction of the light emitting device 201 is the XY plane.

It should be noted that although FIGS. 4A and 4B show only one light emitting device 201, the number of the light emitting device included in the middle component 20 may also be more than one.

The middle component 20 may comprise an electrode 230. The electrode 230 may extend to the end faces of the protrusion 210 and the recess 220. When the middle component 20 is connected with the first end component 10 and the second end component 30 respectively, the electrode 230 can be in electrical contact with the electrodes 130, 330 of the first end component 10 and the second end component 30, respectively. Consequently, the middle component 20 can be electrically connected with the first end component 10 and the second end component 30.

As an example, the protrusion 210 and the recess 220 of the middle component 20 may comprise arcuate portions. For example, as shown in FIG. 4A, the protrusion 210 of the middle component 20 may comprise arcuate portions 210a and 210b, and the recess 220 of the middle component 20 may comprise arcuate portions 220a and 220b. For the first end component 10, the middle component 20 and the second end component 30 in connection, the arcuate portions 220a, 220b of the recess 220 of the middle component 20 may contact with the corresponding arcuate portions of the protrusion 110 of the first end component 10 respectively, and the arcuate portions 210a, 210b of the protrusion 210 of the middle component 20 may contact with the corresponding arcuate portions of the recess 320 of the second end component 30 respectively, thereby enabling the rotation of the first end component 10 and the middle component 20 relative to each other as well as the rotation of the middle component 20 and the second end component 30 relative to each other in the plane perpendicular to the light exit direction of the light emitting device 201, so as to achieve a better rotation effect. Optionally, the electrode 230 may extend to the end face of at least one arcuate portion of the arcuate portions 210a, 210b of the protrusion 210 and the electrode 230 may also extend to the end face of at least one arcuate portion of the arcuate portions 220a, 220b of the recess 220. Of course, what is explained here that the protrusion 210 and the recess 220 of the middle component 20 may comprise arcuate portions is merely an example rather than limitations to the present invention. The protrusion 210 and the recess 220 of the middle component 20 may also comprise portions of other forms that can contact with the corresponding recess or protrusion of the first and the second end components or comprise other connection mechanisms, as long as the first end component and the middle component can rotate relative to each other and the middle component and the second end component can rotate relative to each other in the plane perpendicular to the light exit direction of the light emitting device 201 after being in connection with one another.

The middle component 20 may comprise a carrier formed by an electrode 230, a metal base material and an insulating layer (not shown in the figure). For example, the carrier of the middle component 20 can be fabricated by arranging the insulating layer on the metal base material and then forming the electrode layer on the insulating layer, and the recess 220 and the protrusion 210 are formed by shaping the carrier appropriately. For example, the carrier can adopt the form of a MCPCB that is well known by the skilled person in the art. Of course, the above carrier is merely an example. The middle component according to the embodiment of the present invention is not limited to the form of the carrier. The skilled person in the art can select other types of support structure based on specific applications and actual needs and arrange the electrode layer in the corresponding support structure.

Figure 5A:
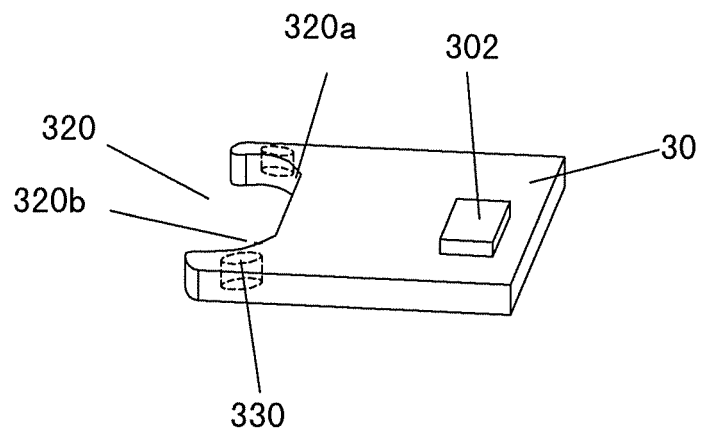
FIGS. 5A and 5B schematically show a perspective view and a top view of a second end component of the light emitting apparatus as shown in FIG. 2 respectively.
Figure 5B:
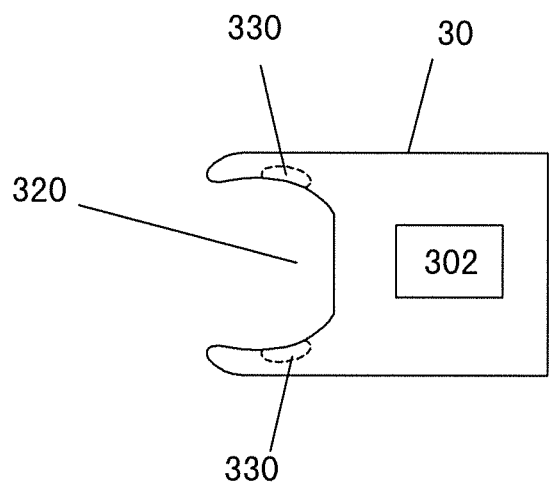

FIGS. 5A and 5B schematically show a perspective view and a top view of the second end component 30, respectively. As shown in FIGS. 5A and 5B, one end of the second end component 30 has a recess 320, and the recess 320 can be connected with the protrusion 210 of the middle component 20, thereby enabling the second end component 30 and the middle component 20 to rotate relative to each other in the plane perpendicular to the light exit direction of the light emitting device 201. The second end component 30 may comprise an electrode 330, and the electrode 330 may extend to the end face of the recess 320. When the second end component 30 and the middle component 20 are in connection, the electrode 330 can be in electrical contact with the electrode 230 of the middle component 20, thereby electric connection between the second end component 30 and the middle component 20 can be achieved.

As an example, the recess 320 of the second end component 30 may comprise arcuate portions, and for the second end component 30 and the middle component 20 in connection, the arcuate portions of the recess 320 can be in contact with the corresponding arcuate portions of the protrusion 210 of the middle component 20. For example, as shown in FIG. 5A, the recess 320 of the second end component 30 may comprises arcuate portions 320a, 320b, and for the second end component 30 and the middle component 20 in connection, the arcuate portions 320a, 320b of the recess 320 can be in contact with the corresponding arcuate portions of the protrusion 210 of the middle component 20 respectively, such that the rotation of the second end component 30 and the middle component 20 relative to each other becomes easy, so as to achieve a better rotation effect. Optionally, the electrode layer 330 may extend to the end face of at least one arcuate portion of the arcuate portions 320a, 320b of the recess 320. Of course, the recess 320 of the second end component 30 that comprises arcuate portions 320a, 320b illustrated here is merely an example rather than limitation to the present invention. The recess of the second end component may also comprise portions in other forms that can contact with the protrusion of the middle component or comprise other connection mechanisms, as long as the second end component and the middle component can rotate relative to each other in the plane perpendicular to the light exit direction of the light emitting device after being in connection with each other.

The second end component 30 may comprise a carrier formed by an electrode 330, a metal base material and an insulating layer (not shown in the figure). For example, the carrier of the second end component 30 can be fabricated by arranging the insulating layer on the metal base material and then forming the electrode layer on the insulating layer, and the recess 320 is formed by shaping the carrier appropriately. For example, the carrier can adopt the form of a MCPCB that is well known by the skilled person in the art. Of course, the above carrier is merely an example. The second end component according to the embodiment of the present invention is not limited to the form of the carrier. The skilled person in the art can select other types of support structure based on specific applications and actual needs and arrange the electrode layer in the corresponding support structure.

Optionally, the second end component 30 may comprise a light emitting device (not shown in the figure). In the case that the second end component 30 comprises a carrier, the light emitting device for example can be arranged on the carrier. Similar as the light emitting device comprised by the middle component, the light emitting device may be any appropriate light emitting device that can serve as a light emitting source, e.g. a LED, an OLED, bulbs or other point light sources or surface light sources. The light emitting device of the second end component 30 can be electrically connected with the electrode 330, such that electric power can be supplied for the light emitting device via the electrode 330, thereby enabling the light emitting device to emit light. By arranging the light emitting device in the second end component 30, the luminance at the end of the light emitting apparatus 2 can be enhanced.

Optionally, as shown in FIGS. 5A and 5B, the second end component 30 may comprise a connector 302. The connector 302 is adapted to be electrically connected with the electrode 330 and the external power supply system of the light emitting apparatus, thereby enabling the external power supply system to supply power for the light emitting device via the connector 302. In the case that the second end component 30 comprises a carrier, the connector 302 can be arranged on the carrier.

As for the light emitting apparatus 2 according to the embodiment of the present invention, the first end component 10, the middle component 20 and the second end component 30 can be connected through an appropriate mechanical mounting manner. For example, the protrusion 110 of the first end component 10 and the recess 220 of the middle component 20, as well as the protrusion 210 of the middle component 20 and the recess 320 of the second end component 30 can be connected through interference fit, clearance fit or transition fit.

The light emitting apparatus according to an embodiment of the present invention can be applied in various occasions, for example, it can be applied in various display apparatuses. The display apparatuses include but not limited to various planar or curved surface display apparatuses, for example, planar or curved surface liquid crystal displays, or the like. For example, when the back light unit of the display apparatus comprises the light emitting apparatus according to the embodiment of the present invention, since the adjacent components in the light emitting apparatus can rotate relative to each other in the plane perpendicular to the light exit direction of the light emitting device, an external force can be applied to enable the whole light emitting apparatus to bend in the plane. Therefore, a curved surface display can be achieved more easily, the yield is improved and image quality of the curved surface display apparatus would not be affected. For example, when the light emitting apparatus according to the embodiment of the present invention is applied in a curved surface display apparatus, the light emitting apparatus can be mounted at a side of a light guide plate in a back light unit, so as to achieve curved surface display by cooperating with a screen. Of course, the external force may also be not applied to the light emitting apparatus while only making respective components in connection, thus the light emitting apparatus will not be bent, therefore, it can be applied in a back light unit of a planar display apparatus to achieve conventional planar display.

On the other hand, because the light emitting apparatus according to the embodiment of the present invention adopts a modularized structure, if a malfunction in the light emitting apparatus occurs, only the malfunctioning component needs to be repaired or replaced, rather than the entire light emitting apparatus. In this way, the cost of use and maintenance will be reduced. In addition, in terms of transportation and packaging, owing to the modularized design of the light emitting apparatus, a smaller packaging volume can be realized which is convenient for transportation.

Figure 6:
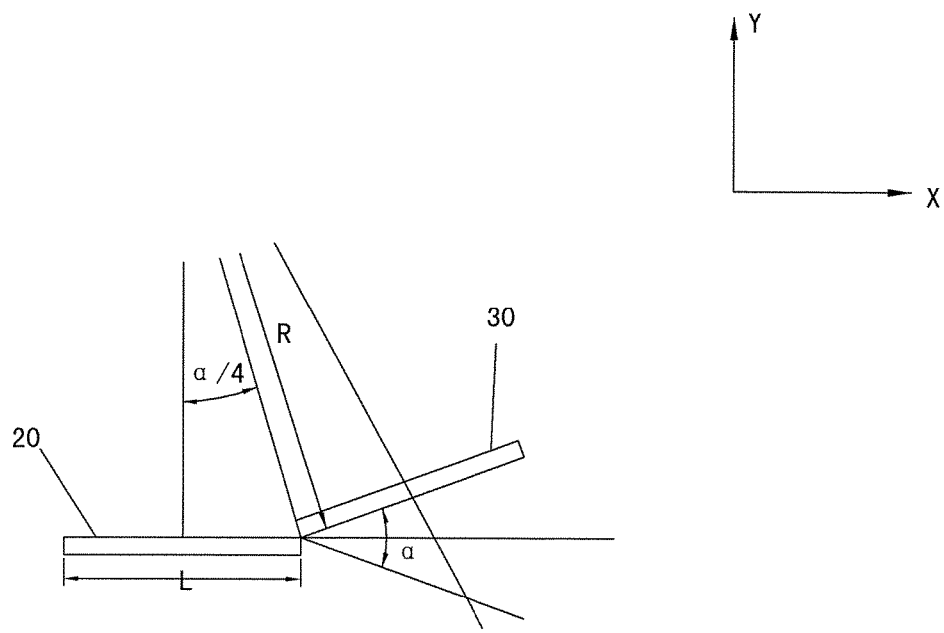
FIG. 6 schematically illustrates calculation of radius of curvature of a light emitting apparatus in a bending state according to an embodiment of the present invention.

FIG. 6 schematically explains calculation of radius of curvature of the light emitting apparatus in a bending state according to an embodiment of the present invention. As shown in FIG. 6, for the sake of conciseness, only the schematic view of rotation of the adjacent middle component 20 and the second end component 30 relative to each other is shown, and the middle component 20 and the second end component 30 are taken as rectangles with certain lengths. Assume that the lengths of the first end component 10, the middle component 20 and the second end component 30 are all L. The rotation angle of the rotation of the middle component 20 and the second end component 30 relative to each other under the external force is $\alpha$. The rotation angle $\alpha$ herein is the angle of rotation of adjacent components relative to each other, i.e., when the adjacent components are in the same straight line, assume that one of the components is fixed, the other component rotates around the connection point of the adjacent components at that angle. FIG. 6 shows the case that the middle component 20 is fixed, and the second end component 30 rotates around the connection point of the middle component 20 and the second end component 30. On a bending curve of the whole light emitting apparatus, the curve formed by rotation of the middle component 20 and the second end component 30 relative to each other is a part of the bending curve of the light emitting apparatus. Referring to FIG. 6, the radius of curvature of the bending curve of the light emitting apparatus is R. For the sake of conciseness, the center of curvature of the bending curve is not shown in the figure. According to a geometrical principle, it can be determined that the central angle to which the length L of the middle component 20 and the second end component 30 corresponds is $\alpha/2$. According to the related geometrical knowledge, the following computing formula can be further obtained:

$$\sin\frac{\alpha}{4} = \frac{\frac{L}{2}}{R}$$

Thus the radius of curvature R of the bending of the light emitting apparatus in the plane perpendicular to the light exit direction of the light emitting device caused by rotation of the middle component 20 and the second end component 30 relative to each other in the plane can be obtained:

$$R = \frac{L}{2} \cdot \frac{1}{\sin\frac{\alpha}{4}}$$

Wherein $\alpha$ is the rotation angle of rotation of the middle component 20 and the second end component 30 relative to each other, L is the length of the middle component 20. It should be noted that in the case that the rotation angle $\alpha$ of the rotation of the middle component 20 and the second end component 30 relative to each other is very small, since $$\sin\frac{\alpha}{4} \approx \tan\frac{\alpha}{4},$$

the $$\sin\frac{\alpha}{4}$$

in the above formula can be also replaced by $$\tan\frac{\alpha}{4}.$$

As for the light emitting apparatus according to an embodiment of the present invention, the minimum radius of curvature R of the bending of the light emitting apparatus, that is, the maximum extent that the light emitting apparatus can be bent, can be altered based on actual needs of different applications. For example, the minimum radius of curvature R can be designed based on factors such as the length of each component in the light emitting apparatus, the rotation angle of rotation of the adjacent components relative to each other in a plane perpendicular to the light exit direction of the light emitting device. Therefore, for the light emitting apparatus according to an embodiment of the present invention, the radius of curvature of its bending can vary between the minimum radius of curvature R and infinity, that is, corresponding to the state that the light emitting apparatus is not bent. Hence, the light emitting apparatus according to the embodiment of the present invention can be applied to curved surface display apparatuses with different curvature requirements. As a result, the universality is enhanced, and thereby the development cost of the curved surface display apparatus can be reduced.

Figure 7A:
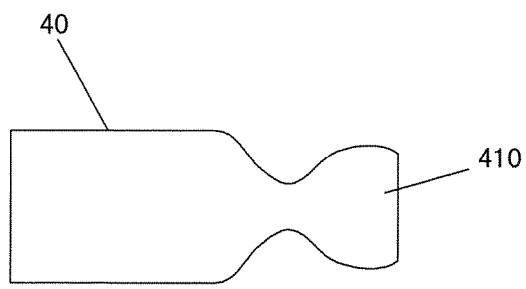
FIGS. 7A to 7D schematically show a light emitting apparatus according to another embodiment of the present invention.
Figure 7B:
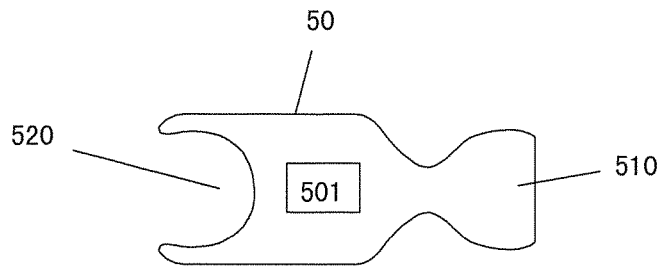
Figure 7C:
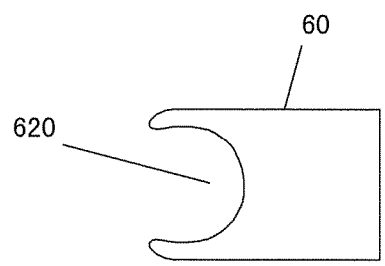
Figure 7D:
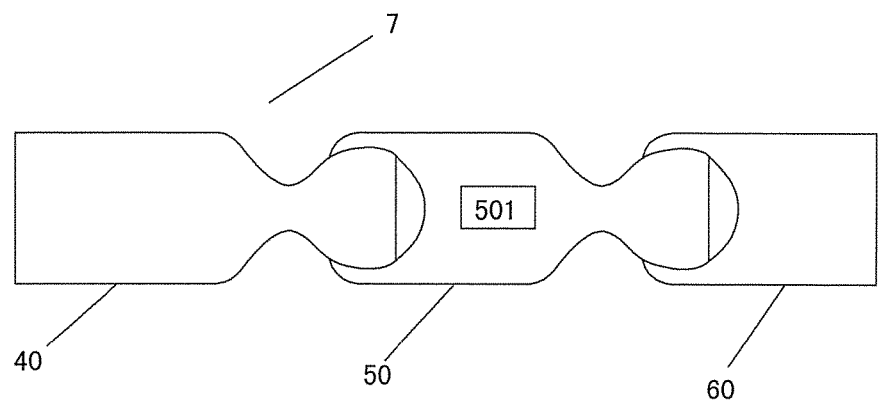

FIGS. 7A to 7D schematically show a light emitting apparatus 7 according to another embodiment of the present invention. The light emitting apparatus 7 may comprise a first end component 40, a middle component 50 and a second end component 60. Wherein FIGS. 7A, 7B, 7C show top views of the first end component 40, the middle component 50 and the second end component 60 respectively, and FIG. 7D shows the connection state of the three components in the form of a top view.

The basic structures of respective components of the light emitting apparatus 7 as shown in FIGS. 7A to 7D are similar to those of the light emitting apparatus 2 as shown in FIG. 2, which will not be repeated here. For example, the middle component 50 may also comprise a light emitting device 501 and may have a recess 520 and a protrusion 510 at its two ends respectively. The first end component 40 may have a protrusion 410 at its end, and the second end component 60 may have a recess 620 at its end.

Compared with the light emitting apparatus 2 as shown in FIG. 2, shapes of the protrusions and recesses of respective components in the light emitting apparatus 7 as shown in FIGS. 7A to 7D are different.

As shown in FIGS. 7A to 7D, each of the protrusion 410 of the first end component 40, the recess 620 of the second end component 60 as well as the recess 520 and the protrusion 510 of the middle component 50 may comprise an arcuate portion. The arcuate portion of the recess 620 of the second end component 60 and the arcuate portion of the recess 520 of the middle component 50 may be major arcs, thereby enabling connection reliability between the first end component 40 and the middle component 50 as well as between the middle component 50 and the second end component 60 to be improved. For example, the recesses 520 and 620 on the whole can be formed as concaved major arc structures respectively, i.e., being formed as recesses in a major arc shape. In this way, processing and manufacturing of recesses of the components can be facilitated, and the manufacturing process of the components of the light emitting apparatus 7 can be simplified. Further, the arcuate portions of the protrusion 410 of the first end component 40 and the arcuate portions of the protrusion 510 of the middle component 50 may also be major arcs, thereby enabling the connection reliability between the first end component 40 and the middle component 50 as well as between the middle component 50 and the second end component 60 to be further improved. For example, the protrusions 410 and 510 on the whole can be formed as convex major arc structures respectively, that is, being formed as protrusions in a major arc shape. In this way, processing and manufacturing of protrusions of the components can be facilitated, and the manufacturing process of the components of the light emitting apparatus 7 can be simplified. Optionally, the arcuate portion of the recess of one component and the arcuate portion of the protrusion of the other component in the adjacent components of the light emitting apparatus 7 may have the same radius of curvature. For example, the arcuate portion of the recess 520 of the middle component 50 and the arcuate portion of the protrusion 410 of the first end component 40 may have the same radius of curvature, and the arcuate portion of the protrusion 510 of the middle component 50 and arcuate portion of the recess 620 of the second end portion 60 may have the same radius of curvature. In this way, when the first end component 40, the middle component 50 and the second end component 60 are in connection, the contact area of the corresponding recess and protrusion of adjacent components will be larger, thereby being favorable for more tight connection between the adjacent components and more stable electric connection during rotation.

Figure 8A:
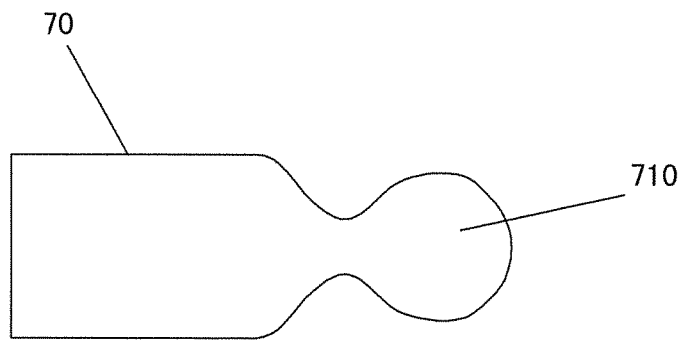
FIGS. 8A to 8D schematically show a light emitting apparatus according to a further embodiment of the present invention.
Figure 8B:
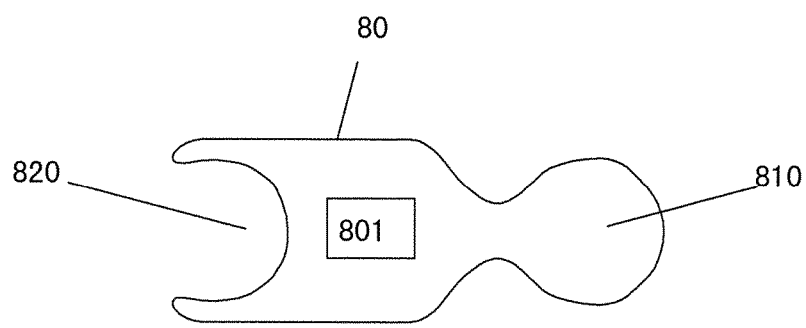
Figure 8C:
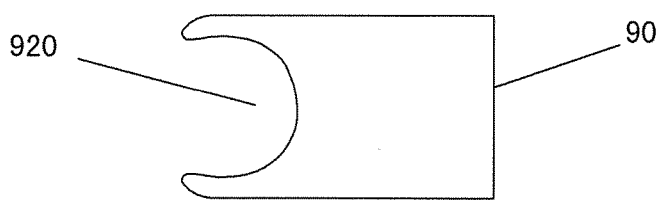
Figure 8D:
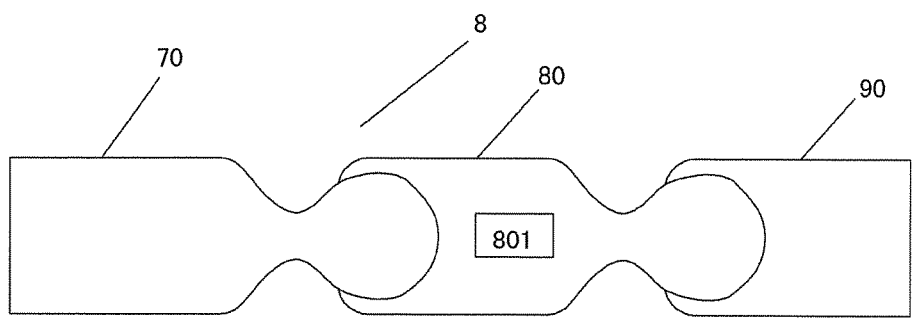

FIGS. 8A to 8D schematically show a light emitting apparatus 8 according to a further embodiment of the present invention. The light emitting apparatus 8 may comprise a first end component 70, a middle component 80 and a second end component 90. FIGS. 8A, 8B, 8C show top views of the first end component 70, the middle component 80 and the second end component 90 respectively, and FIG. 8D shows the connection state of the three components in the form of a top view.

The basic structures of components of the light emitting apparatus 8 as shown in FIGS. 8A to 8D are similar to those of the light emitting apparatus 7 as shown in FIG. 7, which will not be repeated here. For example, the middle component 80 may also comprise a light emitting device 801 and may have a recess 820 and a protrusion 810 at its two ends respectively. The first end component 70 may have a protrusion 710 at its end, and the second end component 90 may have a recess 920 at its end.

Compared with the light emitting apparatus 7 as shown in FIG. 7, shapes of the protrusions and recesses of components in the light emitting apparatus 8 as shown in FIGS. 8A to 8D are different. In the light emitting apparatus 8, for the first end component 70, the middle component 80 and the second end component 90 in connection, there is no gap between the recess and the protrusion of adjacent components.

Figure 9:
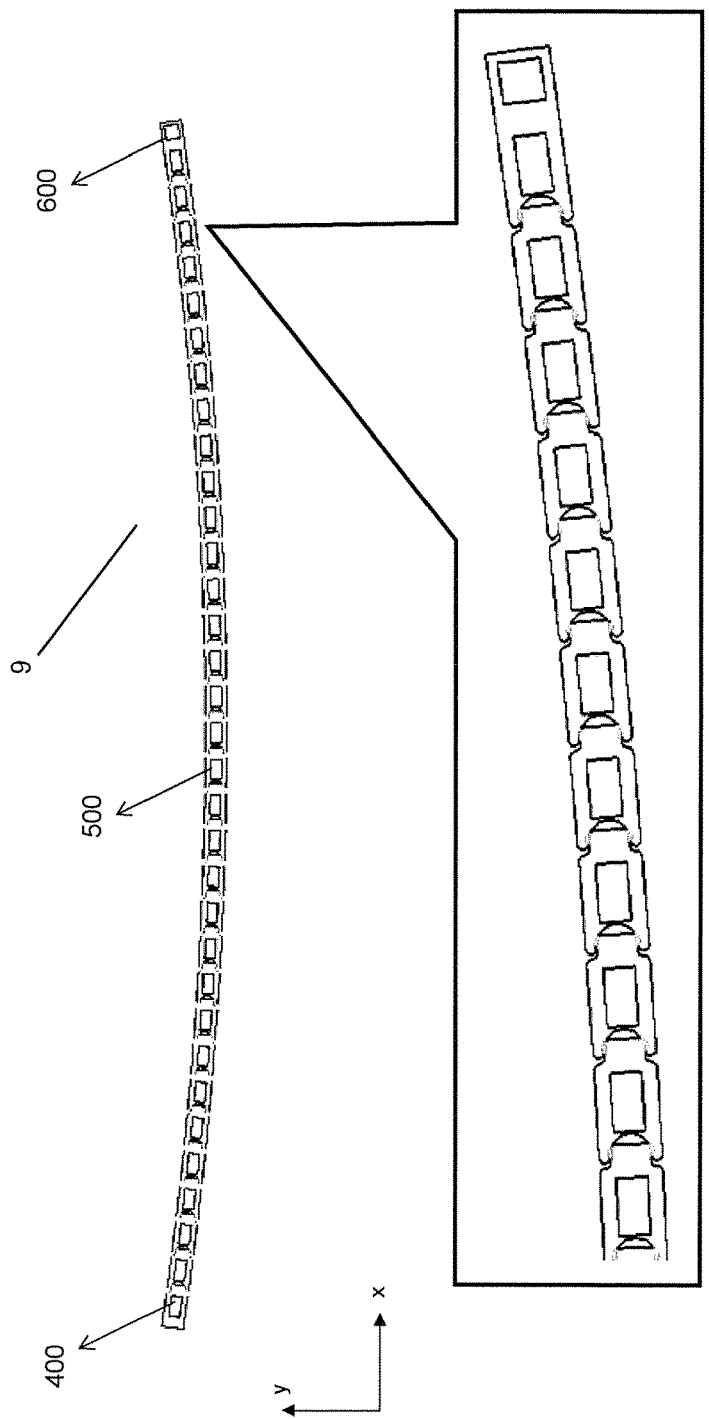
FIG. 9 shows a schematic view of a light emitting apparatus in a bending state according to an embodiment of the present invention.

FIG. 9 schematically shows a schematic view of a light emitting apparatus in the bent state according to an embodiment of the present invention. The light emitting apparatus 9 for example may comprise a first end component 400, a plurality of middle components 500 and a second end component 600. The first end component, the middle components and the second end component may adopt configurations of the corresponding components in the embodiments as described above. For example, the first end component 400 has a protrusion at its end, and the second end component 600 has a recess at its end. The middle component 500 comprises a light emitting device and has a recess and a protrusion at its two ends respectively. The middle component 500 can be connected with the first end component 400 and the second end component 600 respectively by corresponding protrusions and recesses, and the plurality of middle components 500 can be connected successively by corresponding recesses and protrusions, thereby enabling the adjacent components to rotate relative to each other in a plane perpendicular to a light exit direction of the light emitting device, so as to achieve bending of the whole light emitting apparatus.

In the light emitting apparatus according to an embodiment of the present invention, the number of the middle components can be selected based on actual needs and specific applications so as to adjust the length of the whole light emitting apparatus. This can enhance universal applicability or usefulness of the light emitting apparatus. Optionally, the size of each middle component can be completely the same and the structures of the recess and the protrusion of each middle component can also be completely the same. Thus, the manufacture of the light emitting apparatus can be simplified.

The light emitting apparatus according to embodiments of the present invention as described above can be applied to various display apparatuses. For example, the light emitting apparatus can be applied to a back light unit comprised by a display apparatus. The display apparatuses include but not limited to various planar or curved surface display apparatuses, e.g. planar or curved surface liquid crystal display, or the like.

Although exemplary embodiments of the present invention have been described in detail with reference to the drawings, such description should be regarded as illustrative or exemplary rather than restrictive. The present invention is not limited to the disclosed embodiments. The different embodiments described above can also be combined. The skilled person in the art, when carrying out the present invention as claimed, can understand and carry out other modifications of the disclosed embodiments based on the study on the drawings, the description and the claims, and these modifications also fall within the scope of the present invention.

In the claims, the word "comprising" does not exclude other elements or steps. The mere fact that measures are recited in mutually different dependent claims does not indicate that a combination of these measures cannot be used to advantage.

The invention claimed is:

1. A light emitting apparatus comprising:
   a middle component comprising a light emitting device and having a recess and a protrusion at its two ends respectively; and
   a first end component and a second end component, one of the first and second end components having a recess, the other of the first and second end components having a protrusion,
   wherein the middle component can be connected with the first and the second end components respectively by corresponding protrusion and recess so that adjacent components can rotate relative to each other in a plane perpendicular to a light exit direction of the light emitting device,
   wherein each of the recess of said one of the first and second end components and the protrusion of the other of the first and second end components as well as the recess and the protrusion of the middle component comprises an arcuate portion, and
   wherein the arcuate portion of each of the recess of the first or the second end components and the recess of the middle component is a major arc.

2. The light emitting apparatus according to claim 1, wherein for the first end component, the middle component and the second end component in connection, there is a gap between the recess and the protrusion of the adjacent components.

3. The light emitting apparatus according to claim 1, wherein each of the first end component, the middle component and the second end component comprises an electrode layer, and for the first end component, the middle component and the second end component in connection, electrode layers of the adjacent components are in electrical contact with each other.

4. The light emitting apparatus according to claim 3, wherein the electrode layer of each of the first end component, the middle component and the second end component extends to an end face of the recess and the protrusion of the component where it locates.

5. The light emitting apparatus according to claim 1, wherein the number of the middle component is more than one, and the middle components can be connected successively by corresponding recesses and protrusions.

6. The light emitting apparatus according to claim 1, wherein for the first end component, the middle component and the second end component in connection, the arcuate portion of the recess of one component and the arcuate portion of the protrusion of the other component in the adjacent components are in contact with each other.

7. The light emitting apparatus according to claim 6, wherein the arcuate portion of each of the protrusion of the first or the second end components and the protrusion of the middle component is a major arc.

8. The light emitting apparatus according to claim 6, wherein the arcuate portion of the recess of one component and the arcuate portion of the protrusion of the other component in the adjacent components have the same radius of curvature.

9. The light emitting apparatus according to claim 1, wherein at least one of the first end component and the second end component comprises a connector, and the light emitting device can be powered by an external power supply system via the connector.

10. The light emitting apparatus according to claim 1, wherein at least one of the first and the second end components comprises a light emitting device.

11. The light emitting apparatus according to claim 1, wherein the rotation of the adjacent components relative to each other in the plane perpendicular to the light exit direction of the light emitting device enables the light emitting apparatus to bend in the plane, the radius of curvature R of bending is:

$$R = \frac{L}{2} \cdot \frac{1}{\sin\frac{\alpha}{4}}$$

wherein L is a length of the middle component, $\alpha$ is a rotation angle of the rotation of the adjacent components relative to each other.

12. The light emitting apparatus according to claim 1, wherein the light emitting device is an LED.

13. A back light unit comprising a light emitting apparatus, the light emitting apparatus comprising:
   a middle component comprising a light emitting device and having a recess and a protrusion at its two ends respectively; and
   a first end component and a second end component, one of the first and second end components having a recess, the other of the first and second end components having a protrusion, wherein the middle component can be connected with the first and the second end components respectively by corresponding protrusion and recess so that adjacent components can rotate relative to each other in a plane perpendicular to a light exit direction of the light emitting device, wherein each of the recess of said one of the first and second end components and the protrusion of the other of the first and second end components as well as the recess and the protrusion of the middle component comprises an arcuate portion, and wherein the arcuate portion of each of the recess of the first or the second end components and the recess of the middle component is a major arc.

14. The back light unit according to claim 13, wherein each of the first end component, the middle component and the second end component comprises an electrode layer, and for the first end component, the middle component and the second end component in connection, electrode layers of the adjacent components are in electrical contact with each other.

15. The back light unit according to claim 13, wherein for the first end component, the middle component and the second end component in connection, the arcuate portion of the recess of one component and the arcuate portion of the protrusion of the other component in the adjacent components are in contact with each other.

16. The back light unit according to claim 15, wherein the arcuate portion of each of the protrusion of the first or the second end components and the protrusion of the middle component is a major arc.

17. The back light unit according to claim 15, wherein the arcuate portion of the recess of one component and the arcuate portion of the protrusion of the other component in the adjacent components have the same radius of curvature.

18. A display apparatus comprising a back light unit, the back light unit comprising a light emitting apparatus, the light emitting apparatus comprising:

a middle component comprising a light emitting device and having a recess and a protrusion at its two ends respectively; and a first end component and a second end component, one of the first and second end components having a recess, the other of the first and second end components having a protrusion, wherein the middle component can be connected with the first and the second end components respectively by corresponding protrusion and recess so that adjacent components can rotate relative to each other in a plane perpendicular to a light exit direction of the light emitting device, wherein each of the recess of said one of the first and second end components and the protrusion of the other of the first and second end components as well as the recess and the protrusion of the middle component comprises an arcuate portion, and wherein the arcuate portion of each of the recess of the first or the second end components and the recess of the middle component is a major arc.

* * * * *